United States Patent
Eberler et al.

(10) Patent No.: US 9,759,788 B2
(45) Date of Patent: Sep. 12, 2017

(54) MAGNETIC RESONANCE COIL, DEVICE AND SYSTEM

(71) Applicants: Ludwig Eberler, Neumarkt i.d.OPf. (DE); Razvan Lazar, Erlangen (DE); Jürgen Nistler, Erlangen (DE)

(72) Inventors: Ludwig Eberler, Neumarkt i.d.OPf. (DE); Razvan Lazar, Erlangen (DE); Jürgen Nistler, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 440 days.

(21) Appl. No.: 14/465,967

(22) Filed: Aug. 22, 2014

(65) Prior Publication Data

US 2015/0054506 A1    Feb. 26, 2015

(30) Foreign Application Priority Data

Aug. 23, 2013 (DE) .................. 10 2013 216 859

(51) Int. Cl.
| | |
|---|---|
| *G01R 33/36* | (2006.01) |
| *G01R 33/34* | (2006.01) |
| *G01R 33/385* | (2006.01) |

(52) U.S. Cl.
CPC ....... *G01R 33/36* (2013.01); *G01R 33/34076* (2013.01); *G01R 33/3628* (2013.01); *G01R 33/3678* (2013.01); *G01R 33/385* (2013.01)

(58) Field of Classification Search
CPC .............. G01R 33/36; G01R 33/34076; G01R 33/3628; G01R 33/3678; G01R 33/385
See application file for complete search history.

(56) References Cited

U.S. PATENT DOCUMENTS

| | | | |
|---|---|---|---|
| 4,087,824 A | 5/1978 | Alford | |
| 4,887,039 A * | 12/1989 | Roemer | ............. G01R 33/3628 324/318 |

(Continued)

FOREIGN PATENT DOCUMENTS

| | | |
|---|---|---|
| CN | 1533291 A | 9/2004 |
| CN | 102370481 A | 3/2012 |

(Continued)

OTHER PUBLICATIONS

Chinese Office Action for related Chinese Application No. 2014 104 185 24.2 dated Dec. 1, 2016, with English Translation.

(Continued)

*Primary Examiner* — Rodney Bonnette
(74) *Attorney, Agent, or Firm* — Lempia Summerfield Katz LLC (57) ABSTRACT

The embodiments relate to a magnetic resonance coil for a magnetic resonance device with a measuring chamber for an examination object and a cylindrical birdcage antenna arrangement having a plurality of antenna elements disposed at least in some areas around a measuring chamber in the form of circumferential antenna rings or axial outer rods connecting the rings. The antenna elements include electric components, e.g., reactive capacitive and/or inductive systems. The magnetic resonance coil also has at least two antenna feeds, e.g., phase-offset in relation to one another by 90°, by which radio-frequency energy is able to be supplied to the birdcage antenna arrangement. The antenna feeds include at least one symmetrical feed via at least one of the electric components of the birdcage antenna arrangement as well is at least one assigned asymmetrical feed between the birdcage antenna arrangement and a screen connection.

19 Claims, 5 Drawing Sheets

(56) References Cited

U.S. PATENT DOCUMENTS

| | | | |
|---|---|---|---|
| 5,144,240 A * | 9/1992 | Mehdizadeh | G01R 33/34046 |
| | | | 324/318 |
| 2004/0199070 A1 | 10/2004 | Krockel | |
| 2007/0247158 A1* | 10/2007 | Nistler | G01R 33/34046 |
| | | | 324/318 |
| 2008/0300658 A1 | 12/2008 | Meskens | |
| 2011/0175616 A1* | 7/2011 | Ochi | G01R 33/34076 |
| | | | 324/318 |
| 2012/0182013 A1 | 7/2012 | Biber et al. | |
| 2012/0200294 A1 | 8/2012 | Lazar | |
| 2012/0262173 A1 | 10/2012 | Soutome et al. | |
| 2012/0313645 A1 | 12/2012 | Biber et al. | |
| 2013/0300415 A1* | 11/2013 | Harvey | G01R 33/3678 |
| | | | 324/309 |

FOREIGN PATENT DOCUMENTS

| | | |
|---|---|---|
| CN | 102394383 A | 3/2012 |
| JP | 2010177875 A | 8/2010 |
| JP | 5225472 B2 | 7/2013 |

OTHER PUBLICATIONS

Korean Office Action for related Korean Application No. 10-2014-0108541 dated May 29, 2017, with English Translation.

* cited by examiner

MAGNETIC RESONANCE COIL, DEVICE AND SYSTEM

CROSS-REFERENCE TO RELATED APPLICATIONS

This application claims the benefit of DE 10 2013 216 859.4, filed on Aug. 23, 2013, which is hereby incorporated by reference in its entirety.

TECHNICAL FIELD

The embodiments relate to a magnetic resonance coil with a measuring chamber for an examination object, a cylindrical birdcage antenna arrangement having a plurality of antenna elements arranged around the measuring chamber at least in some areas in the form of circumferential antenna rings or outer rods connecting the rings, where the antenna elements includes electric components, (e.g., reactive capacitive and/or inductive systems), and at least two radio-frequency antenna feeds, phase-offset to one another, (e.g., by 90°), by which radio-frequency energy is able to be fed to the birdcage antenna arrangement. The embodiments further relate to a magnetic resonance device operating with the coil, to a magnetic resonance system operating with the magnetic resonance device, and to a method for operating such a magnetic resonance coil.

BACKGROUND

In a magnetic resonance device, the body to be examined may be subjected, with the aid of a basic field magnet system, to a relatively high magnetic field, of 3 or 7 Tesla, for example. In addition, a magnetic field gradient is applied with the aid of a gradient system. Radio-frequency excitation signals (e.g., RF signals) are then sent out by suitable antenna devices via a radio frequency transmit system, which is designed to lead to the nuclear spins of specific atoms resonantly excited by this radio-frequency field being flipped by a defined flip angle in relation to the magnetic field lines of the overall magnetic field. This radio-frequency excitation and the resultant flip angle distribution are also referred to as core magnetization. In the relaxation of the nuclear spin, radio-frequency signals (known as magnetic resonance signals) are emitted. The signals are received by suitable receive antennas and then further processed. The desired image data may be reconstructed from the raw data thus acquired. The radio-frequency signals for nuclear spin magnetization may be sent out by a whole-body coil or body coil. A structure for the coil may be a birdcage antenna having a number of transmit rods that are disposed running in parallel to the longitudinal axis around a patient chamber of the tomograph in which the patient is located during the examination. On the front face side, the antenna rods are each connected capacitively with one another in a ring shape. As well as being used for transmission, this antenna may also be used for receiving magnetic resonance signals.

Local coils, applied directly to the body of the patient, are mostly used nowadays to receive the magnetic resonance signals. Such local coils may also be constructed as birdcage antennas. These antennas are constructed with regard to their antenna elements so that the local coils may receive small signals with great sensitivity, which may then be amplified and used as raw data. A birdcage antenna of this type may form a relatively large-surface antenna on or at a very short distance from the body of the examination object or the patient. By placing the local coils close to the body, the best possible signal-to-noise ratio (SNR) may be obtained in the received signal and thus in the diagnostic information.

To create a circular polarization in the birdcage antennas previously (at least) two electric feed points have been provided for such birdcage antennas, which are disposed geometrically so that the feed points lie orthogonally to one another in the circumference of the cylinder. This orthogonality of the feed points demands spatially (at least) two connection points to the birdcage antenna, which in the circumferential direction of a cylindrical carrier tube enclose an angle of 90° to one another.

Previously, a coaxial cable has been connected at each of the feed points as a radio-frequency cable (RF cable), which establishes a direct connection to a radio-frequency final power stage. This is a problem to the extent that the space conditions in the gap between the body coil and the gradient coils of the gradient system are narrow. The fact that the cables lie at an angle of 90° to one another mechanically prevents them being able to be accommodated in a single cylinder sector. For technical reasons, such as the associated attenuation and the required voltage flashover and power density, the coaxial cable may not be made as thin as might be required.

A further problem stems from the fact that the RF cable shares the space with other cables. Many other lines also run to the gradient coils, to the patient interface, to the microphones, monitors, and cameras, etc., in the space between the body coil and the gradient coils. Intersection or even proximity of these lines to the RF cable or cables is both spatially possible with difficulty and also not recommended because of the electric crosstalk.

The power distribution along the antenna rings (also referred to below in the notation as "end rings," even if the rings are not necessarily present only at the ends) is determining for the creation of the magnetic resonance-relevant B field inside the cylindrical birdcage antenna.

The geometrical orthogonality of the feed points along the cylinder circumference dictates the form and the phase of the sine-wave distribution of the RF currents that flow through the end rings. This current distribution offset alternately at the end face surfaces of the antenna to the end rings, because of the potential difference, is for its part the driving source of the RF currents through the rods. The rod currents are the cause of the effective MR "$B_1$" field and directly influence its spatial orientation, magnitude, and phase through their structure.

The current distribution along the end rings is stationary and resonant, e.g., a "standing wave" is present. In the azimuthal direction on the end rings (along their circumference), each ring has two marked, stationary minima and maxima, of which the position is defined by the type and the position of the feed points. It is resonant in that precisely one full period of a sine or cosine function is completed on the end rings for the basic mode in the azimuthal direction.

The point at which the feed is located geometrically and the type of feed are equally determinant for the position (e.g., spatial phase) of the azimuthal current distribution along the end rings. For this reason, it has been necessary up to now, for the creation of a $B_1$ field with circular polarization, to provide two feed points positioned orthogonally in the circumferential direction, which is controlled electrically phase-offset.

There are however two options for connecting the feed cables to the antenna at its feed points, either symmetrical (also referred to as a connection "along" the antenna element) or asymmetrical in relation to a reference point on the screen between body coil and gradient coil (also referred to as a connection "across" the antenna element).

In symmetrical feeding, this is always applied via a reactive longitudinal component (e.g., a capacitance or an inductance connected in the longitudinal direction of the antenna element) of the antenna. This type of feeding mostly requires a symmetrization in the form of a sheath current filter or/and balun transformer in order to switch from asymmetrical coaxial cable to the symmetrical antenna.

With asymmetrical feeding the feed connection (also called the "feed port") is located between antenna and a radio-frequency screen that screens the gradient coils from the radio-frequency signals of the body coil (also abbreviated hereafter to GC screen or RF screen). Because both the RF cable and also the feed port are asymmetrical in relation to the reference point "screen," a forced symmetrization by baluns may not be necessary, but a decoupling of the RF cable by a sheath current filter (e.g., cable trap) might possibly be provided.

The feeding in such cases may either be applied at the end rings or also at the rods, where traditionally end ring feeding is possible.

In recent times (e.g., 2-channel systems with only two feed points), a so-called vertical-horizontal feeding has proved useful. In this case, the feed points of the end ring circumference are not both arranged at the bottom as previously, at an angle of +/−45° from the vertical, but are arranged at the bottom at (e.g., 6 o'clock) and that the side (e.g., at 9 o'clock). This provides that a feed port is attached above the couch. This point however lies in the shoulder area of the patient. Even through the thick support tube wall, the proximity of the patient to the feed points and a sheath current filter associated therewith may have an undesired detuning effect. Therefore, it is more favorable to place the feed ports not in the area of the support tube able to be touched by the patient, but both below the patient couch where possible.

With non-cylindrical (e.g., elliptical or D-shaped) support tubes, which are increasingly being used on account of increased patient comfort, the lateral distance to the gradient coil (e.g., at 3 o'clock and 9 o'clock) is smaller than above and below. In this case, the vertical-horizontal feed mentioned above (e.g., at 6 o'clock and at 9 o'clock) is not possible because of the construction.

The present prior art is thus that the cables have to be routed to two different feed points of the body coil. The feed points lie geometrically orthogonal to one another along the circumference of the cylindrical antenna support tube. At a certain distance away from the feed point outwards along the support tube, the cables may be bent and routed together. However, despite this, the feed points themselves remain geometrically orthogonal.

It would be mechanically more advantageous, but initially electrically not possible, for the feed points to be able to be placed together, so that the cables run in parallel up to the feed point on the antenna. It would be useful to be able to lay the cables through a single "cable duct" at a single point through the circumference of the cylindrical support tube. As a result of the patient couch, a void occurs below the patient that may be used for the routing of the coaxial cables. This may only be done however if the feed points may be placed next to one another or at least in the same circle sector.

SUMMARY AND DESCRIPTION

The object of the present embodiments is to develop a magnetic resonance coil such that the coil makes possible a higher image quality through lower disruptive effect at the antennas and their antenna feed.

The scope of the present invention is defined solely by the appended claims and is not affected to any degree by the statements within this summary. The present embodiments may obviate one or more of the drawbacks or limitations in the related art.

The magnetic resonance coil is embodied such that the coil includes at least one symmetrical feed via at least one of the electrical components, (e.g., reactive capacitive and/or inductive systems of the birdcage antenna arrangement) and also at least one assigned asymmetrical feed between the birdcage antenna arrangement and a screen connection, (e.g., a radio-frequency screening system).

The advantage here is that with a combination of the symmetrical and asymmetrical antenna feeds, it is possible to dispose the feeds at any given angular position of the magnetic resonance coil, even at a common feed angular position. Via an adjustment of the phase shift, there may be a compensation in order to create a desired standing wave (e.g., circular polarization or elliptical polarization) in the magnetic resonance coil. This is not previously been possible since both the angle between the identical antenna feeds (e.g., either symmetrical or asymmetrical) and also the phase shift itself always had to be 90° or at least was only able to be varied within predefined relatively small limits below 90°.

A further aspect of the present embodiments is that the combination of dissimilar antenna feeds, namely symmetrical and asymmetrical, for a single birdcage antenna makes it possible for the contact points of the antenna feeds to be selected so that the current-conducting lead of the asymmetrical antenna feed will be contacted as close as possible to the geometric center of the two contact points of the assigned symmetrical antenna feed.

It may be possible to achieve that a reference point, e.g., the geometrical center of connecting lines of the symmetrical antenna feed in relation to a contact point of the electric connecting line connected to the birdcage antenna arrangement of the assigned asymmetrical antenna feed is located in a common angular position of the cylindrical birdcage antenna arrangement with the smallest possible angular tolerance.

The provision of the antenna feeds assigned to one another at a common angular position with the highest possible accuracy on the one hand results in a higher image quality through lower disruptive effect at the antennas and their antenna feed, also that undesired interactions between active and inactive antennas in the magnetic resonance device are reduced or eliminated. In addition, the stress (e.g., Specific Absorption Rate (SAR), heating) on the patient with radio-frequency radiation to the antenna feeds is reduced.

The type of feed, whether symmetrical via a component of the antenna (e.g., along) or asymmetrical between antenna and GC screen (e.g., across), directly influences the phase of the current distribution along at the end rings. The current distributions of the two feed types (e.g., along and across) are offset from one another in the azimuthal direction along the end ring and in relation to the feed point at an angle of 90° (e.g., geometrical quadrature). In this way with a symmetrical feed, a current maximum arises at that point in the circumference of the end ring at which, with an asymmetrical feed, a voltage maximum or a voltage minimum arises. This may be referred to as a cosine or sine distribution of the current depending on whether a feed along or across is undertaken.

In other words, two feeds of dissimilar type (e.g., one along and the other across) that are placed however at the same point on the end ring create current distributions that are orthogonal to one another. Seen in spatial terms, the feeds have a 90° phase offset in relation to one another in the azimuthal direction of the end ring.

If the feed is now once symmetrical (e.g., along) and once asymmetrical (e.g., across) at the same point in the end ring, then through overlaying around the end ring circumference the same offset current distributions are produced as if similar feed sources had been used without changing their symmetry in spatial quadrature.

It is thus possible to feed at a single point on the end ring with two separate feed cables and yet still create spatially different, 90°-offset (e.g., orthogonal) current distributions. In such cases, one feed point is low-impedance, thus behaving in the opposite way to a series oscillating circuit and lies in a current maximum. The other by contrast is high-impedance, behaves like a parallel oscillating circuit, and is at a voltage maximum. This leads to the desired decoupling of the two feed ports to one another, but in the same manner as if they were to lie spatially orthogonal to one another.

If identical RF signals, phase-offset by 90° are now fed in at the feed ports as with previous orthogonal feeding, the desired circular-polarized RF signal is obtained in the measuring chamber.

A correct-impedance match of the RF feed cable may be undertaken in any given way. Various options for doing this are known to the person skilled in the art. Likewise baluns may be used if required as symmetrization elements and/or sheath current filters for decoupling from neighboring RF lines.

It is also better for reasons other than the space available to concentrate both feed points at a single point position in the end ring for an antenna, which is to be operated in circular-polarized mode (e.g., CP mode) (also referred to as a CP antenna). This applies above all for the local SAR and the heat stress on the patient at the height of the feed point and at the sheath current filter connected therewith through the support tube.

Under certain circumstances, the local SAR load may be higher at the feed point than at other points along the end rings and rods of the antenna. If the feed has to be at two spatial points, it is geometrically difficult or not possible at all to accommodate both feeds at the same time in the space under the couch. If, on the other hand, the option of concentrating both feed points at a single point in the end ring is considered, both RF cables for a CP antenna may be connected to the antenna at the same point below the couch.

Also, the point at which feeding takes place is, for the same electromagnetic reasons, at its most sensitive in relation to a detuning by proximity or (also indirect, capacitive) contact. If both feed points are attached below the couch, it is to be expected that the stability of the tuning of the antenna is at its greatest regardless of the load position.

Just as sensitive as the feed points are also the sheath current filters, which may easily be detuned by proximity to the load by the support tube wall. If there is the option of positioning of the entire feed system below the couch, this problem may be perceptibly reduced.

A circular-polarized antenna with multiport feed (e.g., 4 ... 8 ... ) is also easier to construct if the number of points at which RF cables are routed is halved. This produces fewer collisions with other lines in the system, above all with the GC power cables, which traditionally have to be positioned in the upper part of the rear service-side magnet opening Therefore, the embodiments thus include not only antennas with two feeds but corresponding antennas with a plurality of feeds.

For local coils with a birdcage structure, such as head or knee coils, regardless of whether the coils are suitable only for receiving or also for transmitting, the option of merging the feed points has great advantages in many respects. If the number of feed points may be concentrated in one place, the structure of the local coil is more filigree and there is no need to penetrate the entire coil with bulky radio-frequency lines. The feed may be concentrated in the base, in the foot part of the coil. The detuning in the feed point and any noise blocking necessary are also easier to design.

As already mentioned, the principle applies for feeding the end rings, but also for feeding the rods or for a combined feed into the end rings and into the rods at the same time.

The embodiments also relate to a magnetic resonance device with a magnetic resonance coil as a body coil, a gradient coil system arranged radially outside the birdcage antenna arrangement when viewed outwards from the measuring chamber and a radio-frequency screening system disposed between the birdcage antenna arrangement and the gradient coil system, which may form a screen connection for the assigned asymmetrical feeding of the magnetic resonance coil. The embodiments further relate to a magnetic resonance system with such a magnetic resonance device with a body coil and with a magnetic resonance coil in the form of a local coil.

The embodiments further relate to a method for operating a magnetic resonance coil for a magnetic resonance device.

In particular, there is provision in an advantageous development for the angular tolerance of the common angular position of symmetrical and asymmetrical antenna feeds assigned to one another to amount to a maximum angular spacing of twice, or a maximum of once, or a maximum of half the angular spacing of two neighboring outer rods. This provides, for example, a magnetic resonance coil with 16 axial antenna rods and 16 capacitors on the end-side 360°-antenna rings, and angular tolerances that correspond to 45°, 22.5°, and 11.25°.

With such an angular position tolerance, standing waves may also be obtained in the antenna without complex compensation precautions. If the deviation from the zero position is too great, this may be done by regulation of the phase shift between the RF signal pulses of the two antenna feeds.

Provided the antennas are to send out an elliptical polarized RF signal, this may be realized by a variation of the phase shift and/or amplitude relationships of the signals to be fed in and, where necessary, also by a small angular offset of the feed points. For example, in this way an elliptically polarized signal with a main axis flipped by n·360°/N to the horizontal may be created (where "N" is the number of antenna rods of the birdcage antenna arrangement). In this case, for example, n may be 1 or 2 for N=16.

In certain embodiments, the mechanical connections of the antenna feeds, at which the lines mechanically held on the device, are located in a common angular position of the magnetic resonance coil. These locations provide a simple and low-cost construction to be produced, since a through line of the two antenna feeds is only needed at a single position of the magnetic resonance coil and the magnetic resonance device. Long paths of the connecting lines of the antenna feeds from the mechanical holding to the position of the electric antenna feeds, through which the danger of the intrusion of noise signals is also avoided, and also the danger of loads on the patient by excessive radio-frequency radiation in the direct vicinity of the patient.

The electric connecting lines of the symmetrical antenna feed may be connected electrically-conductively to at least one of the circumferential antenna rings and/or to a least one of the axial outer rods, (e.g., to an antenna ring on the service side of the magnetic resonance device). Naturally, the electric connecting lines of the symmetrical antenna feed may also be provided with the antenna ring on the patient side (e.g., the side for moving the patient in and out) alone or in addition to the service side.

In such cases, the electric connecting lines of the symmetrical antenna feed may be connected electrically-conductively in a connection area between the circumferential antenna rings and the axial outer rods. This defines the position of the feed at the patient-side end of the antenna rods, so that no transmission losses from antenna ring to the antenna rods thus occurs, and also an ideal dipole antenna is realized, which once again improves the image quality.

In certain embodiments, two electric connecting lines of the symmetrical antenna feed are connected electrically-conductively to the end-side connecting lines of at least one capacitor on a circumferential antenna ring and/or on an axial outer rod. This is a very simple and effective connection option, since through this the feed points are at a very small distance from one another.

In certain embodiments, the electric connecting lines of the symmetrical and asymmetrical antenna feed are electric conductors of a coaxial cable, namely an inner conductor and an outer conductor insulated from the inner conductor and surrounding and screening it. Naturally, other types of line may be used for the antenna feed, such as conductors insulated from one another and twisted.

In an advantageous development, one of the electric connecting lines, (e.g., the inner conductor of the coaxial cable of the symmetrical antenna feed), is electrically short-circuited to one of the electrical connections, (e.g., an inner conductor of the coaxial cable), of the symmetrical antenna feed. One may therefore also connect the two inner conductors, electrically-conductively, and subsequently connect their connecting line to the antenna ring or to the axial antenna rod.

It is advantageous if the electric connecting lines of the symmetrical antenna feed are connected electrically-conductively to the end-side connecting lines of an even number (e.g., 2, 4, 6, 8, . . . ) of capacitors connected serially after one another on the circumferential end rings and/or on the axial outer rods and one of the electric connecting lines, (e.g., the inner conductor of the coaxial cable), of the asymmetrical antenna feed is connected electrically-conductively to the electrical connecting line of these capacitors, (e.g., by two center capacitors). In this way, a very harmonic feed of the radio-frequency impulses on the antenna is produced, by which the image quality may be significantly enhanced by comparison with the previously mentioned connection variants with the short-circuited inner conductors of the antenna feeds, since on the one hand a small angular tolerance is present, on the other hand the asymmetrical RF excitation is fed in the geometrical center of the two connecting lines of the symmetrical RF excitation. In other words, this makes the feed of the two RF signals significantly more harmonious and thus the interferences between the two RF signals and thus the standing wave that arises in the antenna are significantly more stable.

In particular, the symmetrical antenna feed (but also the asymmetrical antenna feed) may have one or more sheath current filters and/or balun transformers that are intended to prevent the electric cables of the antenna feeds themselves acting as antenna, which would disrupt the actual antenna operation of the magnetic resonance coil and thus would reduce the image quality. In particular, the balun transformer may be dispensed with completely in another form of embodiment with asymmetrical antenna feeding.

As already mentioned, on the one hand, the magnetic resonance coil may be used as a local coil, (e.g., as a head coil or a knee coil), for imaging only one part of the patient's body in the measuring chamber. On the other hand, the magnetic resonance coil may be used as a body coil for imaging an entire patient, if possible, in the measuring chamber. Naturally the two variants may be combined, so that a local coil, which surrounds a part of the patient's body, is located within a body coil with symmetrical and asymmetrical antenna feeding. Both coils may then be operated separately and independently of one another, but also combined, e.g., the body coil as a transmit coil and the local coil as a receive coil.

In addition, a couch for the patient is disposed in the measuring chamber as mentioned, where advantageously for the magnetic resonance coil the common angular position of the electric connection lines of the antenna feeds is disposed within the couch, (e.g., at around 6 o'clock). This has the advantage that the entire chamber above the patient remains freely accessible for the patient themselves and possibly additional objects provided (e.g., measurement sensors, if necessary for the regulation of the RF field, patient supervision systems, monitors, etc.), so that no undesired disruption of the antenna feeds at the antenna and the patient occurs, so that both the image quality and also the load on the patient are optimized.

DETAILED DESCRIPTION

Figure 1:
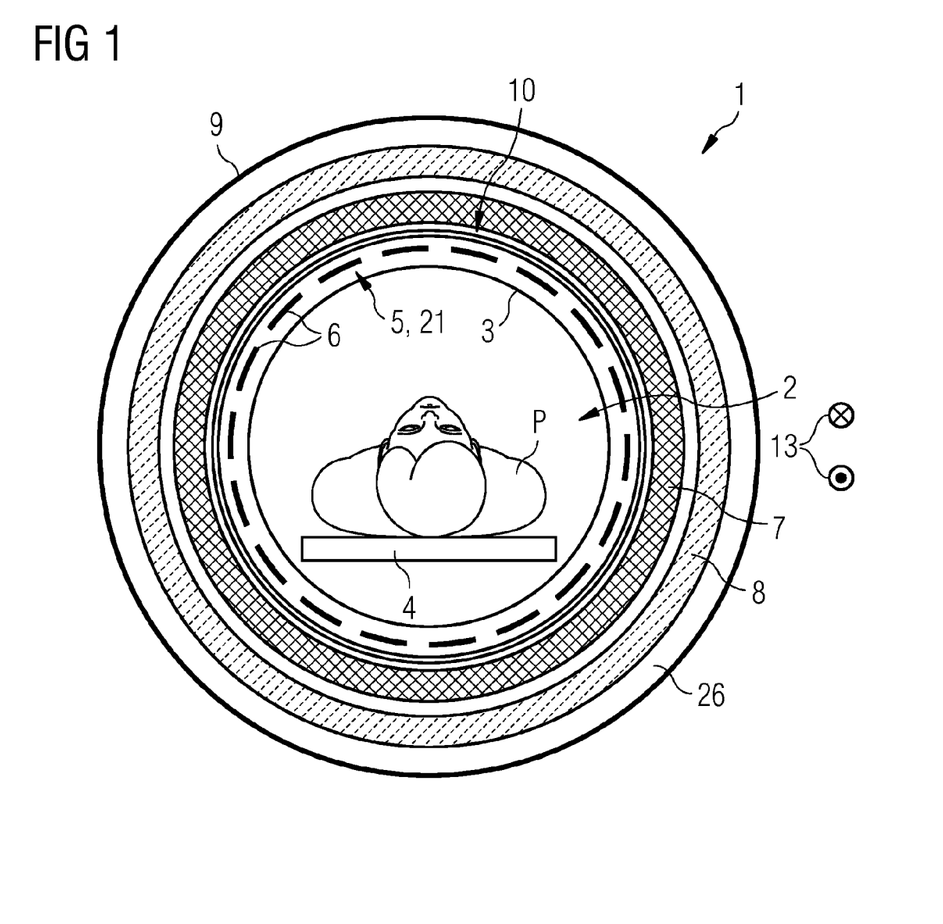
FIG. 1 depicts a cross-section through the scanner housing of a magnetic resonance tomography device with a body coil in accordance with an exemplary embodiment.

FIG. 1 depicts a schematic diagram of a cross-section through a scanner of a magnetic resonance tomography device 1. Various components are disposed here within the scanner housing 9, where, in the center, a measuring chamber 2, known as the patient tunnel (frequently also referred to as the "bore") remains free. In this measuring chamber, the object under examination, patient P, is disposed on a couch 4. The couch 4 is able to be moved by a motor within the measuring chamber 2 in the longitudinal direction 13 or out of the measuring chamber 2 via one of the end face sides 26 for holding the patient P. The measuring chamber 2 is delimited by an inner wall 3 of the scanner housing 9, which, for example, includes a plastic tube made mostly of fiber-glass. This inner wall 3 is therefore also often referred to as the "support tube" 3, since the antenna structure of the body coil may be also attached thereto.

Located at a short radial distance outwards or likewise directly on the support tube 3 is an antenna arrangement 5, with a plurality of individual antenna elements 6 that may represent a transmit/receive antenna in the form of a conventional birdcage antenna. Located radially outside the antenna arrangement 5 is a radio-frequency screening system 10. This radio-frequency screening system 10 is used to screen a gradient coil system 7 lying farther outwards from the radio-frequency signals. Only a circular circumferential gradient coil for gradient formation in the z direction (e.g., in the longitudinal direction of the scanner or of the patient) of the gradient coil system 7 is depicted here. The gradient coil system may have further gradient coils, which are likewise disposed in the scanner housing 9, in order to also apply magnetic field gradients in other spatial directions at right angles to the z direction. Located radially outside the gradient coil system 7 is a basic field magnet 8 that provides the basic magnetic field.

Further components of such a magnetic resonance device 1 include components such as control devices to enable the basic field magnets and the magnetic field gradients to be controlled accordingly. The magnetic resonance device also includes radio-frequency transmit devices for creating and amplifying the radio frequency pulses, in order to transmit the pulses via the antenna arrangement, and corresponding receive devices in order to be able to receive, amplify and further process magnetic resonance signals from the measuring chamber or the examination object via the antenna arrangement(s). The transmit and receive devices also mostly have connections to enable external local coils to be connected, which are placed on, under, or at the examination object and may be also moved into the measuring chamber 2 of the magnetic resonance device 1.

All these components and the way in which they function are known to the person skilled in the art and are thus not depicted in FIG. 1 for reasons of clarity. It is also pointed out here that the embodiments may not only be used with magnetic resonance devices that have a cylindrical patient tunnel, but also with magnetic resonance devices designed differently.

Figure 2:
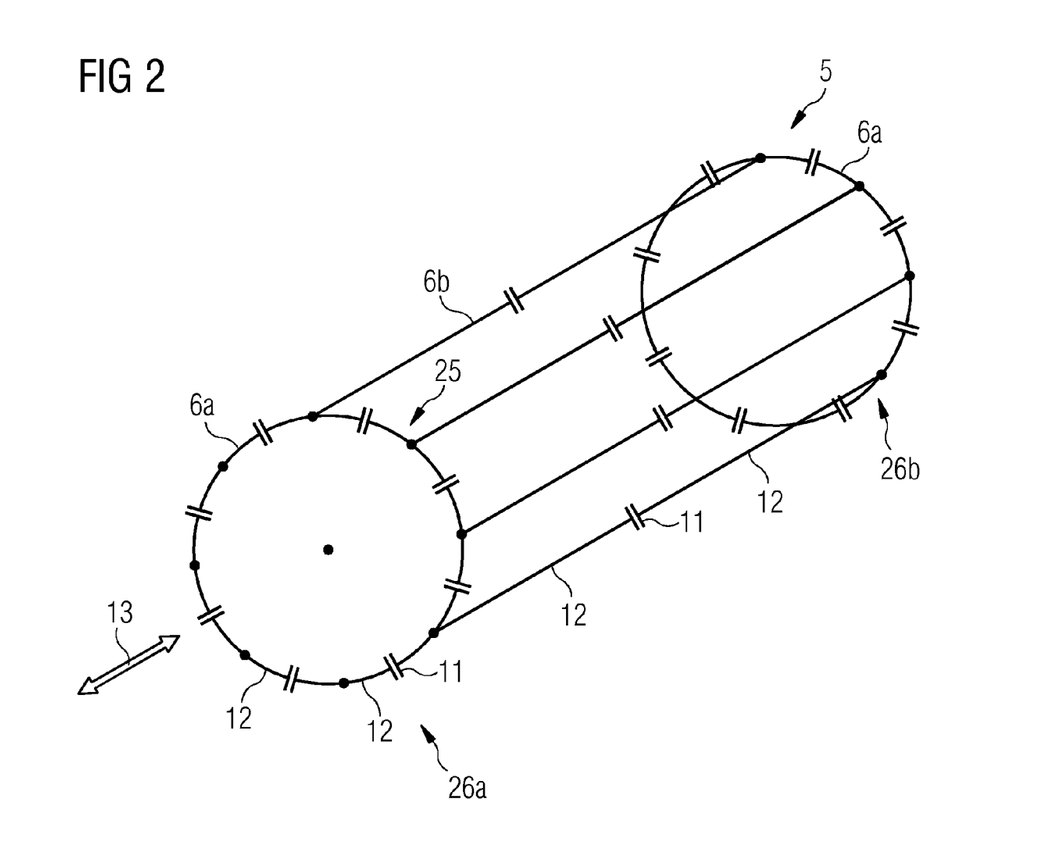
FIG. 2 depicts a schematic perspective diagram of the body coil of the magnetic resonance tomography device embodiment in accordance with FIG. 1.

FIG. 2 depicts a schematic of the antenna elements 6 of the circular-cylindrical birdcage antenna 5, where the precise shape of the birdcage antenna arrangement 5 is not of special importance, so that other cylinder shapes, with an elliptical, arc-shaped, or D-shaped form or polygonal basic surface, but also a combination of these basic surface shapes may be possible.

The antenna elements 6 include two circular-shaped antenna rings 6a spaced away from one another, which are connected to one another here with eight antenna rods 6b running axially and parallel to one another over the connection area 25. Both the antenna rings 6a and also the axial antenna rods 6b are interrupted by electric components (e.g., capacitors 11), at multiple regular intervals, where, for example, the electric components are spaced approximately the same distance from one another. Thus, the antenna rings 6a are interrupted by eight identical capacitors 11 eight times, which are separated from one another by equal angular spacings. The parallel antenna rods 6b on the other hand are only interrupted by a single centrally-arranged capacitor 11. The two end-face side antenna rings 6a lie on the so-called patient side 26a, via which a patient P is able to be moved in the movement directions 13 into the measuring chamber 2 of the magnetic resonance device 1. The patient P is able to be moved out of the chamber again, and on the other hand on the so-called service side 26b, on which the input, processing, and output devices of the magnetic resonance system are disposed.

The antenna rings 6a and the antenna rods 6b themselves otherwise act as an inductance, since the frequencies of the RF system lie in the MHz range.

Figure 3:
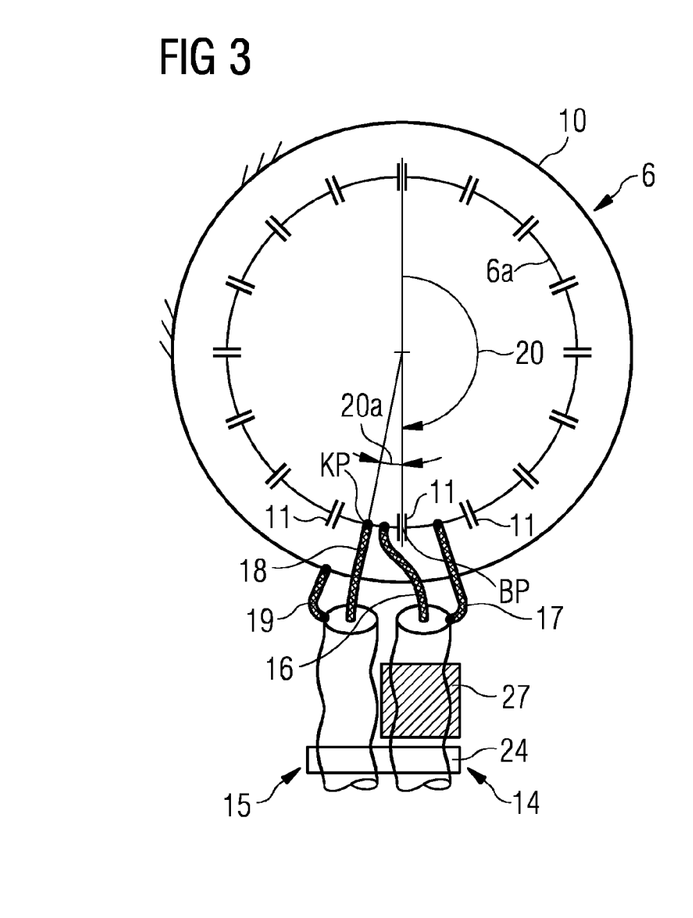
FIG. 3 depicts a first embodiment of the antenna feed.
Figure 4:
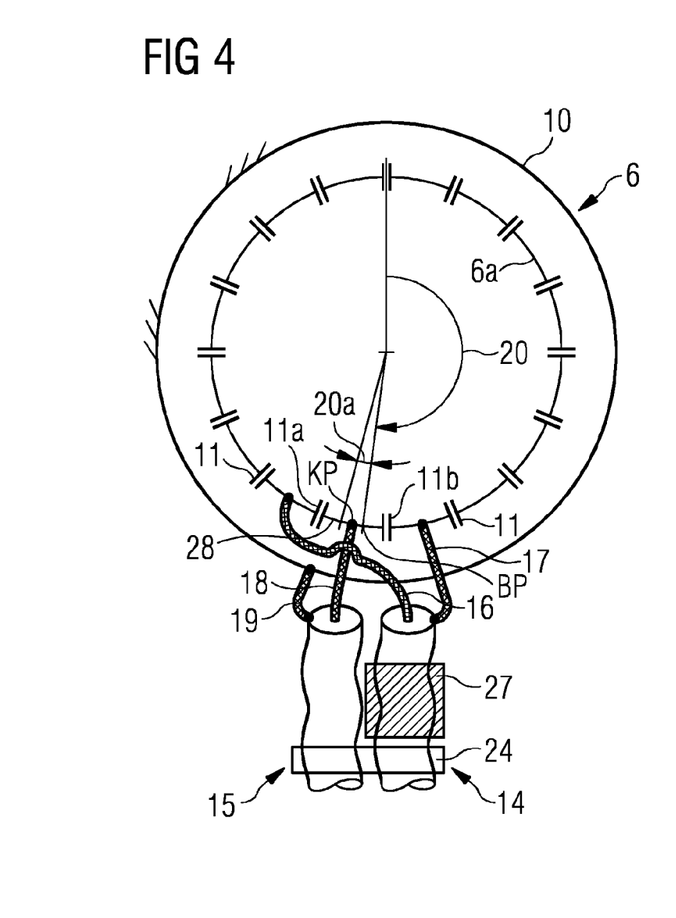
FIG. 4 depicts a second embodiment of the antenna feed.

FIGS. 3 and 4 depict an end-face side view of the embodiment of the birdcage antenna 5 according to FIG. 2, but with a surrounding radio-frequency screening system 10, and also with the two antenna feeds 14, 15. Only two variants of the electric circuit of the antenna feed are depicted here, where FIG. 3 depicts a simple embodiment and FIG. 4 discloses an improved embodiment thereof in respect of the field symmetry and the field orthogonality of the RF field.

In FIG. 3, the center conductor 18 of the asymmetrical antenna feed 15 is connected electrically-conductively to a contact point KP over the same part of the antenna ring 6a to the center conductor 16 of the symmetrical antenna feed 14, and therefore short-circuited with the conductor, where this part of the antenna ring 6a is isolated via capacitors 11 from the adjacent parts of the antenna ring 6a.

The outer conductor 17, (e.g., the screening of the symmetrical antenna feed 14), is connected electrically-conductively here with the neighboring part of the antenna ring 6a, while the outer conductor 19, (e.g., the screening of the asymmetrical antenna feed 15), is connected electrically-conductively to the RF screen 10 surrounding the birdcage antenna 5. In this way, all electric conductors 16-19 of the two antenna feeds 14, 15 are kept as short as possible, through which possible interference is reduced, and thus the image quality is increased as well as the SAR load (SAR=Specific Absorption Rate) for the patient being lowered.

Since, however, the distance is relatively large from the contact point KP of the center conductor 18 of the asymmetrical antenna feed 15 to the reference point BP in the middle between the capacitor plates 11, (which is bridged by the lines 16, 17 of the symmetrical antenna feed 14, e.g., the tolerance 20a of the angular position 20), the field symmetry and field orthogonality of the RF field created by the two feeds 14, 15 is somewhat distorted here.

If this is not desired, the form of embodiment in accordance with FIG. 4 may provide that in an ideal manner both the reference point BP and also the contact point KP of the center conductor 18 of the asymmetrical antenna feed 15 lie in the center of the antenna ring 6a between 2 neighboring capacitors 11a and 11b, so that through this an ideal field symmetry and field orthogonality of the RF field created by the two feeds 15 may be achieved. The tolerance 20a of the angular position 20 is therefore almost zero here.

In FIGS. 3 and 4, the reference number 24 also depicts the mechanical fastening of the symmetrical and asymmetrical antenna feeds 14, 15, with which the feeds are fixed to the magnetic resonance device. It is of advantage here that only one shared through-feed of the antenna feeds 14, 15 through the RF screen system 10 is needed, which in its turn has positive effects on image quality and SAR load on the patient.

Figure 5:
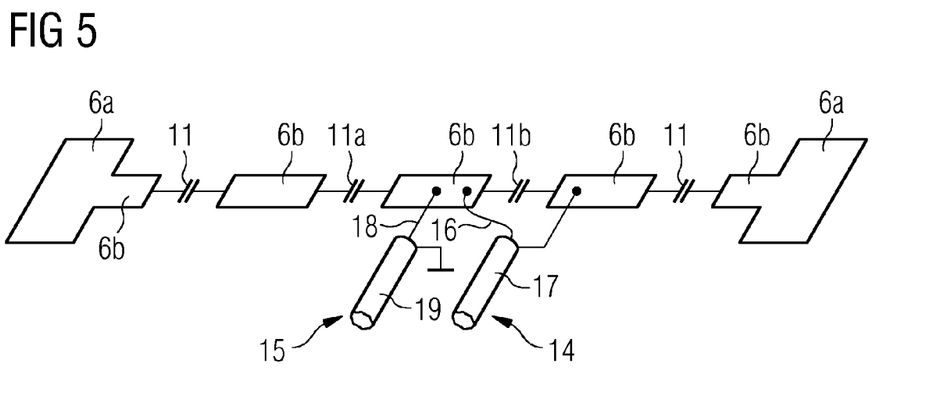
FIG. 5 depicts a third embodiment of the antenna feed.
Figure 6:
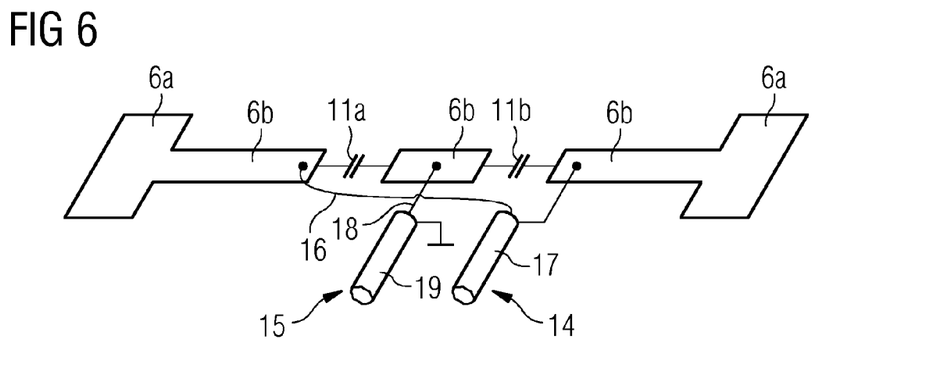
FIG. 6 depicts a fourth embodiment of the antenna feed.
Figure 7:
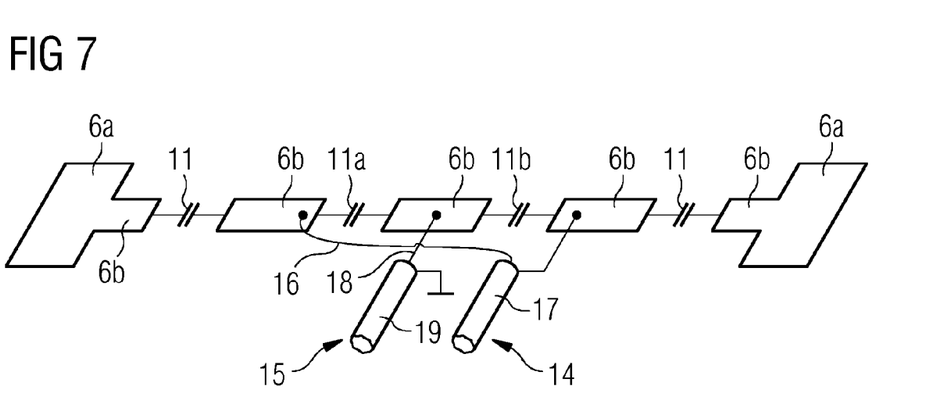
FIG. 7 depicts a fifth embodiment of the antenna feed.

FIGS. 5 to 7 now disclose three variants of so-called rod feeds, (e.g., the antenna feeds 14, 15 are electrically connected to the antenna rods 6b instead of to the antenna rings 6a), as depicted in FIGS. 3 and 4.

Like FIG. 3, FIG. 5 depicts a simple feed, where here a multipart antenna rod 6b is depicted, of which the five individual parts are separated from one another or connected to one another by four capacitors 11. Attached to the two end-side rods 6b are the two end-face-side rings 6a. Electrically contacted with the center rod 6b are the two center conductors 17, 18 of the two antenna feeds 14, 15, where the outer conductor 19 of the asymmetrical antenna feed 15 is applied electrically-conductively to ground or zero potential or screen 10 and the outer conductor 17 of the symmetrical antenna feed 14 is connected electrically-conductively to a further rod 6b, adjacent to the center rod 6b. Through this, good symmetry of the RF feed and thus good field symmetry and field homogeneity of the RF field emitted by the antenna 6 is achieved.

The forms of embodiment in accordance with FIGS. 6 and 7 depict a somewhat improved version in that, like the embodiments in accordance with FIG. 4, the two connection lines 16, 17 of the symmetrical antenna feed 14 are each connected electrically-conductively to a part of the rod 6b, a further center rod 6b is located adjacent to these two parts of the rod 6b, via a capacitor 11 in each case, and connects these to each other. The center conductor 18 of the asymmetrical antenna feed 15 is contacted electrically-conductively on the center rod 6b, while the outer conductor 19 is connected electrically-conductively to ground or zero potential or, for example, the RF screen 10.

The identical circuitry of FIG. 6 applies to the very equivalent form of embodiment in accordance with FIG. 7, with the single difference that here the two are additionally divided into two parts on the center rod 6b to the left and right via a rod 6b adjoining a capacitor, separated in each case by a further capacitor 11.

Figure 8:
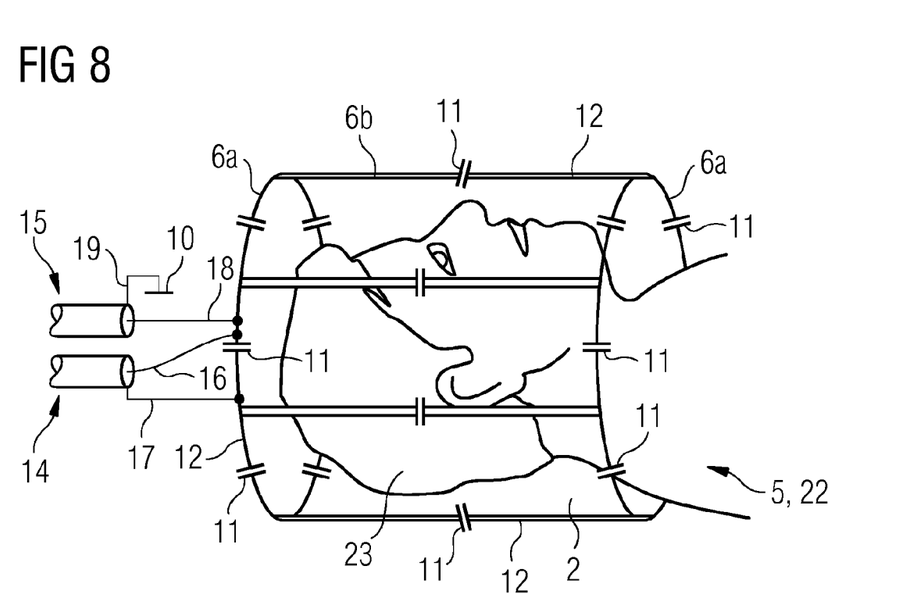
FIG. 8 depicts a schematic perspective diagram of a head coil.

In FIG. 1, a body coil 21 is depicted as the magnetic resonance coil, in which a complete patient P is located, while in FIG. 8 a local coil in the form of a head coil 22 is depicted, in which a head 23 is accommodated in a measuring chamber 2 surrounded by the birdcage antenna structure of the local coil. Naturally, instead of a head 23, a knee or any other body parts may be accommodated. Both types of magnetic resonance coil may be operated individually but also in combination with one another. Instead, the antenna feeds 14, 15 of the head coil 22 are exactly the same as the embodiment of the antenna feeds 14, 15 of the body coil 21 in accordance with FIG. 3, so that identical reference characters also relate to identical components. The head coil 22 itself may then also have a screen 10, to which the asymmetrical feed is connected. As an alternative any given ground connection may serve as a screen connection or even a connection to the RF screen of the gradient coils.

In conclusion, it is pointed out once again that the method and devices described in detail above involve exemplary embodiments and that the basic principle may also be varied by the person skilled in the art in wide areas without departing from the area of the embodiments, provided it is specified by the claims. It is thus expressly pointed out that all capacitors 11, 11a, 11b depicted in the figures may be equipped with identical capacitance; however, in other forms of embodiment these may readily possess different capacitances. The specific dimensioning of the capacitances is not however the subject matter of the present embodiments, just as little as their positioning on the other parts 6a, 6b of the antenna 6, since this is sufficiently known in the prior art. For the sake of completeness it is also pointed out that the use of the indefinite article "a" or "an" does not exclude the features concerned also being able to be present more than once.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance coil for a magnetic resonance device, the magnetic resonance coil comprising:
   a measuring chamber for an examination object;
   a cylindrical birdcage antenna arrangement having a plurality of antenna elements in the form of circumferential antenna rings or axial outer rods connecting the rings, wherein the antenna elements are disposed around the measuring chamber, and wherein the antenna elements comprise electric components; and
   at least two antenna feeds phase-offset to one another by which radio-frequency energy is able to be fed to the birdcage antenna arrangement,
   wherein the antenna feeds comprise (1) at least one symmetrical feed via at least one of the electric components of the birdcage antenna arrangement and (2) at least one assigned asymmetrical feed between the birdcage antenna arrangement and a screen connection.

2. The magnetic resonance coil as claimed in claim 1, wherein the electric components are reactive capacitive systems, inductive systems, or reactive capacitive systems and inductive systems.

3. The magnetic resonance coil as claimed in claim 1, wherein the at least two antenna feeds phase-offset by 90°.

4. The magnetic resonance coil as claimed in claim 1, wherein the screen connection is a radio-frequency screening system.

5. The magnetic resonance coil as claimed in claim 1, wherein a reference point that is a geometrical center of two electric connecting lines of the symmetrical antenna feed is located opposite a contact point of an electric connecting line of the assigned asymmetrical antenna feed connected to the birdcage antenna arrangement within an angular tolerance in a common angular position of the cylindrical birdcage arrangement.

6. The magnetic resonance coil as claimed in claim 5, wherein the angular tolerance of the common angular position of the symmetrical antenna feed and the asymmetrical antenna feed assigned to one another amounts to a maximum of twice of the angular spacing of two neighboring outer rods.

7. The magnetic resonance coil as claimed in claim 1, wherein the electric connecting lines of the symmetrical antenna feed are connected electrically-conductively with: (1) at least one circumferential antenna ring of the circumferential antenna rings, (2) at least one of the axial outer rods, or (3) at least one circumferential antenna ring and at least one of the axial outer rods.

8. The magnetic resonance coil as claimed in claim 7, wherein the electric connecting lines are connected electrically-conductively with the at least one circumferential antenna ring on a service side of the magnetic resonance device.

9. The magnetic resonance coil as claimed in claim 7, wherein the electric connecting lines of the symmetrical antenna feed are connected electrically-conductively in a connection area between the circumferential antenna rings and the axial outer rods.

10. The magnetic resonance coil as claimed in claim 1, wherein at least one electric connecting line of the symmetrical antenna feed is connected electrically-conductively to one side of a capacitor on a circumferential antenna ring, an axial outer rod, or a circumferential antenna ring and an axial outer rod.

11. The magnetic resonance coil as claimed in claim 1, wherein the electric connecting lines of the symmetrical antenna feed and the asymmetrical antenna feed are electric conductors of a coaxial cable, and
wherein one electric connecting line of the electric connecting lines of the symmetrical antenna feed is short-circuited with one electric connection of the electric connections.

12. The magnetic resonance coil as claimed in claim 1, wherein the electric connecting lines of the symmetrical antenna feed and the asymmetrical antenna feed are electric conductors of a coaxial cable, and
wherein the electric connecting lines of the symmetrical antenna feed are connected electrically-conductively to an outer side of two respective capacitors lying at the end side of an uneven number of capacitors, the uneven number of capacitors connected serially behind one another on (1) the circumferential end rings, (2) the axial outer rods and one of the electric connecting lines, or (3) the circumferential end rings and the axial outer rods and one of the electric connecting lines.

13. The magnetic resonance coil as claimed in claim 12, wherein an inner conductor of a coaxial cable of the asymmetrical antenna feed is connected electrically-conductively with a respective opposite side of neighboring capacitors in the geometrical center of the neighboring capacitors.

14. The magnetic resonance coil as claimed in claim 1, wherein the symmetrical antenna feed, the asymmetrical antenna feed, or the symmetrical antenna feed and the asymmetrical antenna feed comprise sheath current filters, a balun transformer, or sheath current filters and a balun transformer.

15. The magnetic resonance coil as claimed in claim 1, wherein the magnetic resonance coil is a local coil.

16. The magnetic resonance coil as claimed in claim 1, wherein the magnetic resonance coil is a body coil, and
wherein the body coil is configured to image an entire patient.

17. A magnetic resonance device comprising:
a magnetic resonance coil, wherein the magnetic resonance coil is a body coil, the magnetic resonance coil comprising:
  a measuring chamber for an examination object;
  a cylindrical birdcage antenna arrangement having a plurality of antenna elements in the form of circumferential antenna rings or axial outer rods connecting the rings, wherein the antenna elements are disposed around the measuring chamber, and wherein the antenna elements comprise electric components; and
  at least two antenna feeds phase-offset to one another by which radio-frequency energy is able to be fed to the birdcage antenna arrangement, wherein the antenna feeds comprise (1) at least one symmetrical feed via at least one of the electric components of the birdcage antenna arrangement and (2) at least one assigned asymmetrical feed between the birdcage antenna arrangement and a screen connection;
a gradient coil system disposed radially outside a birdcage antenna arrangement viewed from a measuring chamber outwards; and
a radio-frequency screening system disposed between the birdcage antenna arrangement and the gradient coil system.

18. The magnetic resonance device as claimed in claim 17, wherein a couch for an examination object is disposed in the measuring chamber, and
wherein, for the magnetic resonance coil, a common angular position of electric connecting lines of antenna feeds is below the couch.

19. A method for operating a magnetic resonance coil for a magnetic resonance device, the method comprising:
feeding radio-frequency energy via at least two antenna feeds to a birdcage antenna arrangement of the magnetic resonance coil,
wherein the birdcage antenna arrangement comprises a plurality of antenna elements disposed at least in some areas around a measuring chamber in the form of circumferential antenna rings or axial outer rods connecting the rings,
wherein the antenna elements comprise electric components, and
wherein the antenna feeds include at least one symmetrical feed via at least one of the electric components of the birdcage antenna arrangement, as well as at least one assigned asymmetrical feed between the birdcage antenna arrangement and a screen connection.

* * * * *